(12) United States Patent
Lue et al.

(10) Patent No.: US 12,260,130 B2
(45) Date of Patent: Mar. 25, 2025

(54) MEMORY DEVICE FOR COMPUTING IN-MEMORY

(71) Applicant: MACRONIX International Co., Ltd., Hsinchu (TW)

(72) Inventors: Hang-Ting Lue, Hsinchu County (TW); Tzu-Hsuan Hsu, Chiayi County (TW); Teng-Hao Yeh, Hsinchu County (TW); Chih-Chang Hsieh, Hsinchu (TW); Chun-Hsiung Hung, Hsin-Chu (TW); Yung-Chun Li, New Taipei (TW)

(73) Assignee: MACRONIX International Co., Ltd., Hsinchu (TW)

(*) Notice: Subject to any disclaimer, the term of this patent is extended or adjusted under 35 U.S.C. 154(b) by 181 days.

(21) Appl. No.: 18/161,900

(22) Filed: Jan. 31, 2023

(65) Prior Publication Data
US 2024/0028211 A1    Jan. 25, 2024

Related U.S. Application Data

(60) Provisional application No. 63/388,647, filed on Jul. 13, 2022.

(51) Int. Cl.
*G06F 17/16* (2006.01)
*G06F 3/06* (2006.01)
(Continued)

(52) U.S. Cl.
CPC ............. *G06F 3/0679* (2013.01); *G06F 7/49* (2013.01); *G06F 17/16* (2013.01); *G06N 3/00* (2013.01);
(Continued)

(58) Field of Classification Search
CPC ...... G06F 3/0679; G06F 7/49; G06F 15/7821; G06F 17/16; G06N 3/00; G06N 3/063;
(Continued)

(56) References Cited

U.S. PATENT DOCUMENTS

| 10,381,071 | B1 | 8/2019 | Si et al. |
| 10,748,603 | B2 * | 8/2020 | Sumbul ................... G06N 3/065 |

(Continued)

FOREIGN PATENT DOCUMENTS

| JP | H0346195 | 2/1991 |
| JP | 2001057096 | 2/2001 |

(Continued)

OTHER PUBLICATIONS

"Office Action of Taiwan Counterpart Application", issued on Mar. 27, 2024, pp. 1-4.

(Continued)

*Primary Examiner* — Huan Hoang
*Assistant Examiner* — Justin Bryce Heisterkamp
(74) *Attorney, Agent, or Firm* — J.C. PATENTS

(57) ABSTRACT

A memory device for CIM, applicable to a 3D AND-type flash memory, includes a memory array, input word line pairs, and a signal processing circuit. The memory array includes first and second pairs of memory cells. Each first pair of memory cells includes a first memory cell set coupled to a first GBL and a second memory cell set coupled to a second GBL. Each second pair of memory cells includes a third memory cell set coupled to the first GBL and a fourth memory cell set coupled to the second GBL. Each input word line pair includes a first input word line coupled to the first and the second memory cell sets, and a second input word line coupled to the third and the fourth memory cell sets s. The signal processing circuit is coupled to the first and second global bit lines.

20 Claims, 10 Drawing Sheets

(51) Int. Cl.
  *G06F 7/49*   (2006.01)
  *G06N 3/00*   (2023.01)
  *G11C 7/06*   (2006.01)
  *G11C 7/10*   (2006.01)
  *G11C 7/18*   (2006.01)
  *G11C 8/14*   (2006.01)
  *G11C 16/04*  (2006.01)
  *G11C 16/24*  (2006.01)
  *G11C 16/28*  (2006.01)
  *G11C 27/00*  (2006.01)

(52) U.S. Cl.
  CPC ............ *G11C 7/062* (2013.01); *G11C 7/1006* (2013.01); *G11C 7/18* (2013.01); *G11C 8/14* (2013.01); *G11C 16/0466* (2013.01); *G11C 16/24* (2013.01); *G11C 16/28* (2013.01); *G11C 27/005* (2013.01)

(58) Field of Classification Search
  CPC ......... G11C 7/062; G11C 7/1006; G11C 7/18; G11C 8/14; G11C 16/0466; G11C 16/24; G11C 16/28; G11C 27/005; G11C 11/5671; G11C 11/54; G11C 16/08
  See application file for complete search history.

(56) References Cited

U.S. PATENT DOCUMENTS

| | | | | |
|---|---|---|---|---|
| 10,971,226 | B2 | 4/2021 | Le Gallo-Bourdeau et al. | |
| 11,221,827 | B1* | 1/2022 | Hsu | G06N 3/063 |
| 11,423,960 | B2* | 8/2022 | Chang | G11C 7/18 |
| 11,495,298 | B1* | 11/2022 | Hsu | G11C 16/24 |
| 2013/0215683 | A1* | 8/2013 | Lee | H10B 43/10 |
| | | | | 365/185.29 |
| 2017/0117035 | A1* | 4/2017 | Mokhlesi | G11C 16/10 |
| 2019/0096486 | A1* | 3/2019 | Hama | G11C 7/1006 |
| 2020/0034686 | A1* | 1/2020 | Chiu | G06N 3/065 |
| 2020/0034697 | A1* | 1/2020 | Choi | G11C 11/1673 |
| 2020/0035305 | A1* | 1/2020 | Choi | G11C 11/54 |
| 2021/0110244 | A1* | 4/2021 | Hoang | G06F 17/16 |
| 2021/0192325 | A1* | 6/2021 | Hoang | G11C 13/0069 |
| 2021/0280239 | A1* | 9/2021 | Tran | G06N 3/063 |
| 2021/0326110 | A1* | 10/2021 | Ma | G11C 11/54 |
| 2022/0019441 | A1* | 1/2022 | Rosing | G06N 3/084 |
| 2022/0084581 | A1* | 3/2022 | Kawasumi | G11C 11/4094 |
| 2022/0108742 | A1 | 4/2022 | Li et al. | |
| 2022/0189547 | A1* | 6/2022 | Dray | G11C 11/1673 |
| 2022/0246212 | A1* | 8/2022 | Lue | G11C 16/08 |
| 2022/0375523 | A1* | 11/2022 | Lin | G11C 16/24 |
| 2023/0011276 | A1* | 1/2023 | Chiu | G11C 7/1063 |
| 2023/0085583 | A1* | 3/2023 | Lin | G11C 16/06 |
| | | | | 365/185.17 |
| 2023/0282292 | A1* | 9/2023 | Tseng | G11C 16/24 |
| | | | | 365/185.24 |
| 2023/0368836 | A1* | 11/2023 | Wang | G11C 7/1006 |
| 2023/0377633 | A1* | 11/2023 | Yeh | G11C 16/24 |
| 2023/0409217 | A1* | 12/2023 | Ghaly | G06F 3/0679 |

FOREIGN PATENT DOCUMENTS

| | | |
|---|---|---|
| JP | 2023515679 | 4/2023 |
| TW | I757645 | 3/2022 |
| WO | 2021178003 | 9/2021 |

OTHER PUBLICATIONS

"Notice of Allowance of Japan Counterpart Application," issued on Apr. 16, 2024, p. 1-p. 3.

* cited by examiner

MEMORY DEVICE FOR COMPUTING IN-MEMORY

CROSS-REFERENCE TO RELATED APPLICATION

This application claims the priority benefit of U.S. application Ser. No. 63/388,647, filed on Jul. 13, 2022. The entirety of the above-mentioned patent application is hereby incorporated by reference herein and made a part of this specification.

BACKGROUND

Technical Field

The disclosure relates to a memory device, and particularly relates to a memory device for in-memory computing.

Description of Related Art

Vector matrix multiplication (VMM) is the suitable approach for "memory-centric computing" in deep neural network (DNN), Cosine similarity, and simulated annealing. VMM accelerators with high density and high bandwidth are suitable to complement the Von-Neumann digital approach.

There are several issues with using in-memory computing for vector matrix multiplication. First, VMM often involves both positive (+) and negative (−) inputs and weights. Thus, how to implement an analog circuit for positive and negative polarities is a challenging topic. Besides, the inputs and weights are often multi-bit resolution ($32b$-FP in software, but can be reduced to 4 bits in edge DNN, and even fewer (for example, 2 to 3 bits) in similarity search).

Therefore, the development of a VMM accelerator is a major issue in the field.

SUMMARY

The disclosure provides a VMM accelerator configured using a 3D AND-type NOR flash memory.

According to an embodiment of the disclosure, a memory device for computing in-memory is provided, including a memory array, a plurality of input word line pairs, and a signal processing circuit. The memory array includes a plurality of first pairs of memory cells and a plurality of second pairs of memory cells. Each of the plurality of first pairs of memory cells includes a first memory cell set coupled to a first global bit line and a second memory cell set coupled to a second global bit line, and each of the plurality of second pairs of memory cells includes a third memory cell set coupled to the first global bit line and a fourth memory cell set coupled to the second global bit line. Each of the plurality of input word line pairs includes a first input word line and a second input word line. The first input word line is coupled to the first memory cell set of and the second set memory cell, and the second input word line is coupled to the third memory cell set and the fourth set of memory cells. The signal processing circuit is coupled to the first global bit line and the second global bit line.

Based on the above, according to an embodiment of the disclosure, the operation architecture of the memory device for in-memory computing is constructed using a 3D AND-type NOR flash memory. Thus, in the embodiment of the disclosure, the data in the memory may not be read to the outside to be computed by another ALU, so the system data can be saved, and data update is not always required for the data read to the external storage device. In addition, the architecture of the disclosure can achieve high-capacity, high-speed, and high-efficiency in-memory computing. Thus, VMM computing, IMS computing, etc. that are commonly used in big data or AI applications such as image processing, face recognition, deep neural network, etc., can be implemented through the architecture of the disclosure.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

The disclosure relates to an architecture for in-memory computing. Through this architecture, the data stored in a memory does not need to be read out to be sent to an external arithmetic logic unit (ALU) for computing. The read current (Icell) can be directly obtained by sensing the weight stored in the memory and the voltage value input by the word line. After accumulating the read currents, vector matrix multiplication (VMM), Cosine similarity, or in-memory search (IMS) can be performed directly. A 3D AND-type NOR flash memory device is an architecture suitable for such in-memory computing (CIM).

Figure 1:
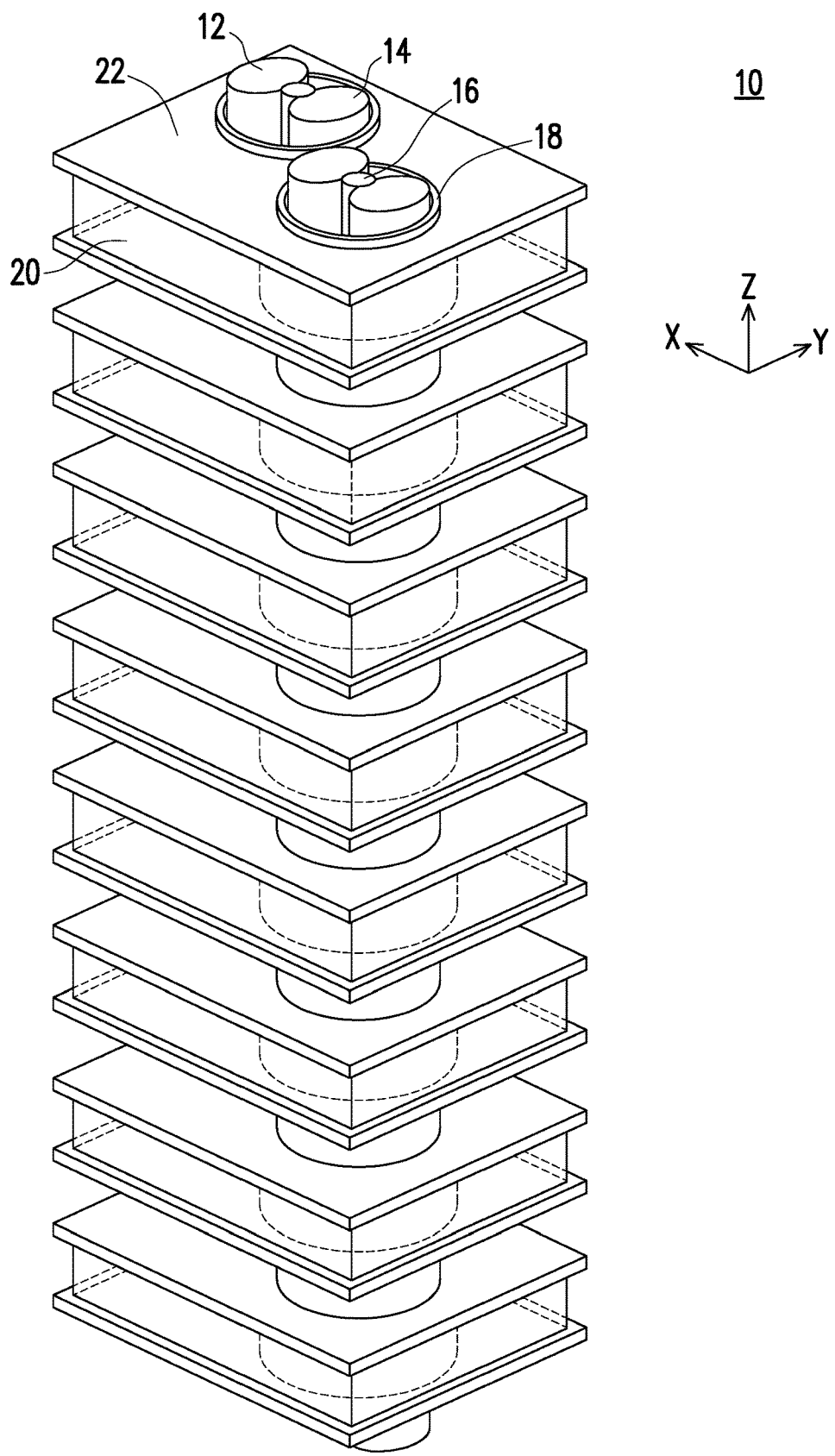
FIG. 1 is a schematic diagram showing a structure of the 3D AND-type NOR flash memory device according to an embodiment of the disclosure.

FIG. 1 is a schematic diagram showing a structure of the 3D AND-type NOR flash memory device according to an embodiment of the disclosure. The 3D AND-type NOR flash memory device may include a plurality of stack structures 10 shown in FIG. 1. For example, the stack structure 10 extends in the vertical direction (Z direction) to form multiple gate layers 20, which may be further coupled to conductive layers serving as word lines (not shown). The ONO layer 22 are formed between the gate layer 20 and the channel pillar 18. The stack structure 10 includes a hollow channel pillar 18 extending along the vertical direction Z. Two conductive pillars 12 and 14 extending along the vertical direction Z are formed in the hollow channel pillar 18, which may serve as the source and drain of the memory cell. The two conductive pillars 12 and 14 have an isolation structure 16 extending along the vertical direction Z to isolate the two conductive pillars 12 and 14.

The stack structure 10 may be, for example, a 32-layer structure, which can easily generate billions of memory cells in a small grain size to be used for a large amount of CIM. In other embodiments, the stack structure 10 may be 64-layer structure or higher.

Figure 2:
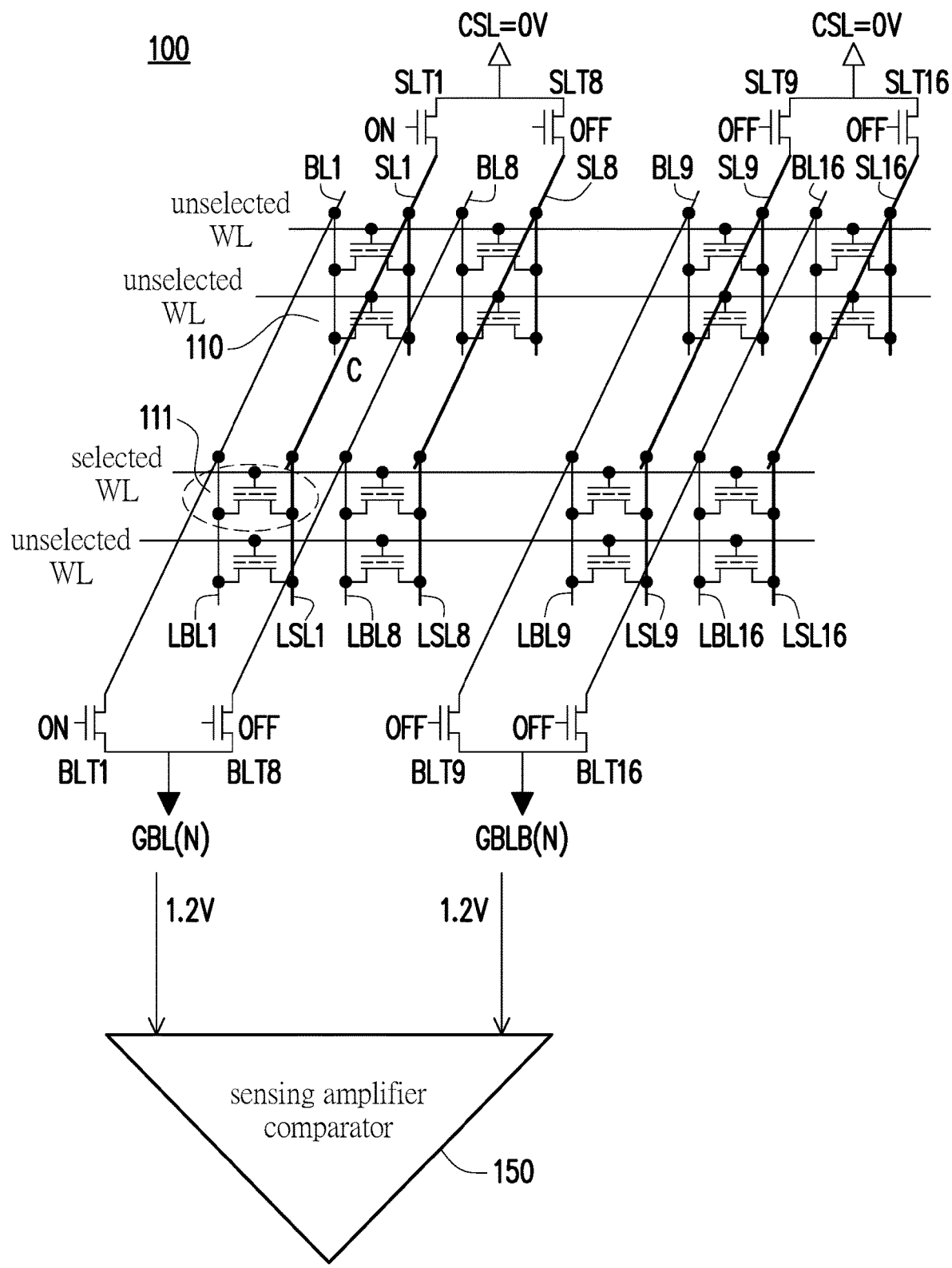
FIG. 2 is a schematic diagram showing an equivalent circuit of the 3D AND-type NOR flash memory device according to an embodiment of the disclosure.

FIG. 2 is a schematic diagram showing an equivalent circuit of the 3D NOR flash memory device according to an embodiment of the disclosure. As shown in FIG. 2, the 3D NOR flash memory device 100 is configured as a stack structure, such as a stack 110, a stack 111, and so on. Each stack is formed by stacking a plurality of memory cells C. For example, the stack 100 includes a plurality of local bit lines LBL1 to LBL16 and a plurality of local source lines LSL1 to LSL16. Each of the local bit lines LBL1 to LBL16 extends vertically and is connected to the first end (source/drain end) of each memory cell, and each local bit line of each stack (for example, 110, 111) is coupled to the corresponding one of the bit lines BL1 to BL16 such as the bit lines BL1, BL8, BL9, BL16, and so on as shown in FIG. 2. In addition, each of the local source lines LSL1 to LSL16 extends vertically and is connected to the second end (the other source/drain end) of each memory cell, and each of the local source lines LSL1 to LSL16 of each stack (for example, 110, 111) is coupled to the corresponding one of the source lines SL1 to SL16 such as the source lines SL1, SL8, SL9, SL16, and so on as shown in FIG. 2.

Further, one set of bit lines BL1, BL8, and so on is further coupled to a first global bit line GBL(N) via bit line transistors BLT1, BLT8, and so on, respectively. That is, taking FIG. 2 as an example, two first drain side conductive strings (BL1, BL8) are coupled to the memory cells and the first global bit line GBL (N). The other set of bit lines BL9, BL16, and so on is further coupled to a second global bit line GBLB(N) via the bit line transistors BLT9, BLT16, and so on, respectively. That is, two second drain side conductive strings (BL9, BL16) are coupled to the memory cells and the second global bit line GBLB(N). In addition, the source bit lines SL1, SL8, SL9, SL16, and so on are further coupled to the common source line CSL via the source line transistors SLT1, SLT8, SLT9, SLT16, and so on, respectively.

Further, the control ends (gates) of the memory cells C in the same layer of each stack are coupled to the same word line WL. As an example, there are 4K word lines WL with 128 sectors. In addition, the first global bit line GBL(N) and the second global bit line GBLB(N) are coupled to a sensing amplifier comparator 150. In the normal read mode, the sensing amplifier comparator 150 senses the read current Icell flowing through the selected memory cell C.

In the normal read mode, assuming that the memory cell C circled in FIG. 2 is to be read, the word line WL corresponding to the memory cell C is applied with the read voltage Vread (the selected word line), such as Vread=7V; and the word lines corresponding to the other unselected memory cells C are applied with the unselected voltage, such as 0. In addition, the bit line transistor BLT1 is turned on, and the other bit line transistors BLT8, BLT9, BLT16, and so on are turned off. At the same time, the source line transistor SLT1 is turned on, so that the source line SL1 is coupled to the common source line CSL (for example, applied with 0V), and the other source line transistors SLT8, SLT9, and SLT16 are turned off. The first global bit line GBL(N) and the second global bit line GBLB(N) are applied with 1.2V, for example. Accordingly, the read current Icell of the selected memory cell is transmitted to the sensing amplifier comparator 150. Thus, the read current Icell of the selected memory cell C can be sensed through the first global bit line GBL(N), and at this time, the first global bit line GBL(N) serves as the read path. In addition, the second global bit line GBLB(N) serves as the capacitive matching path.

Figure 3A:
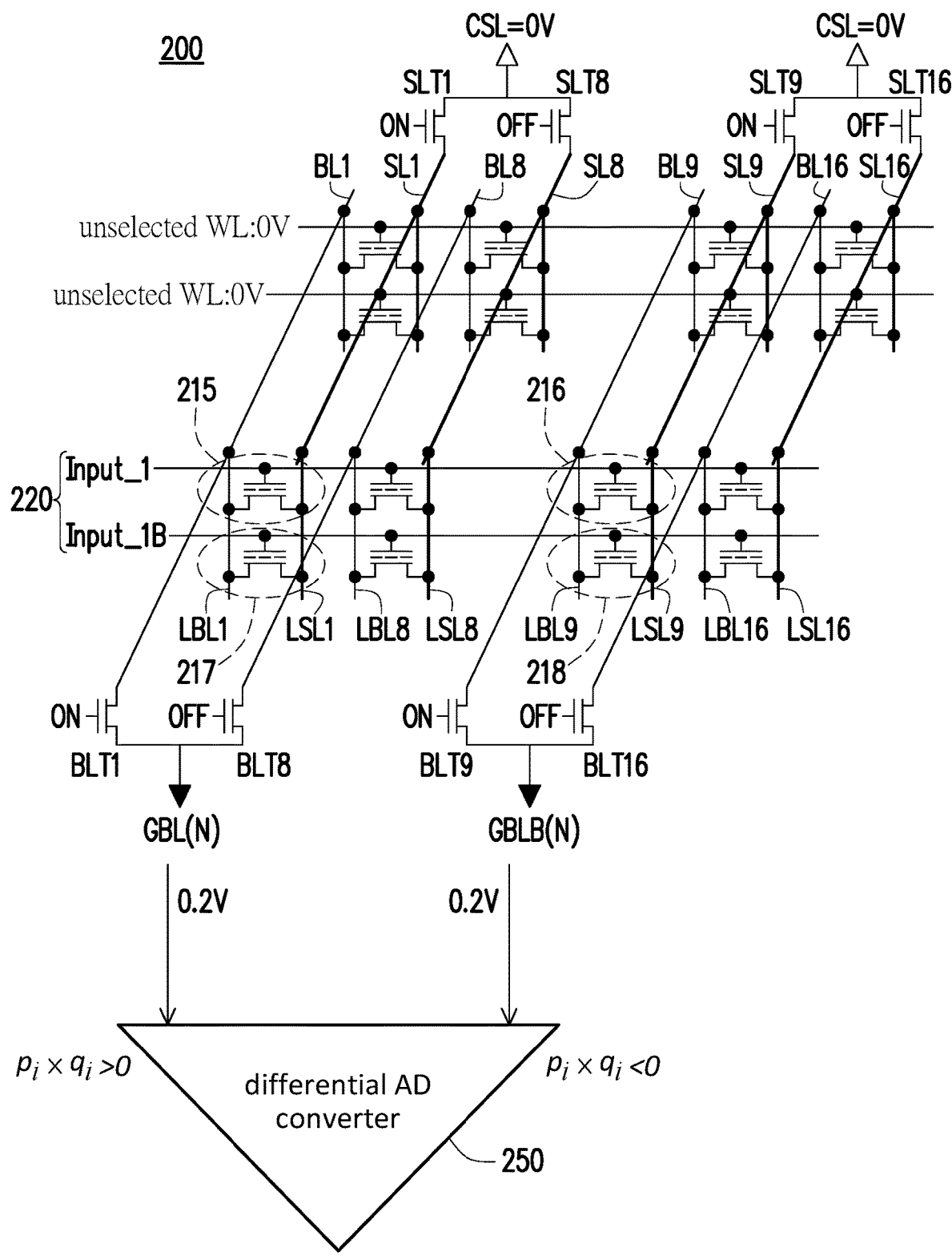
FIG. 3A is an explanatory diagram showing a vector matrix multiplication operation performed by the 3D AND-type NOR flash memory device according to an embodiment of the disclosure.

FIG. 3A is an explanatory diagram showing a vector matrix multiplication operation performed by the 3D NOR flash memory device according to an embodiment of the disclosure. The following describes how to apply the above-mentioned 3D NOR flash memory device to perform vector matrix multiplication (VMM), or called in-memory computing (CIM). This embodiment describes an example of a single-level weight CIM.

When applied to VMM, the memory device 100 of FIG. 2 is reconfigured as a memory device 200. The same or similar reference numerals will continue to be used, and only the differences are indicated. As shown in FIG. 3A, the memory array (for example, configured with the stacks 110 and 111 shown in FIG. 2) includes a plurality of first pairs of memory cells and a plurality of second pairs of memory cells. Here, for simplicity, only one first pair of memory cells and one second pair of memory cells are illustrated. The first pair of memory cells includes a first memory cell set (or referring to a first memory cell) 215 coupled to the first global bit line GBL(N) and a second memory cell set (or referring to a second memory cell) 216 coupled to the second global bit line GBLB(N), and the second pair of memory cells includes a third memory cell set (or referring to a third memory cell) 217 coupled to the first global bit line GBL(N) and a fourth memory cell set (or referring to a fourth memory cell) 218 coupled to the second global bit line GBLB(N). In this embodiment, each of the first to the fourth memory cell sets 215-218 comprises one memory cell.

The memory device 200 further includes a plurality of input word line pairs 220, one of which is illustrated here as an example. Each of the input word line pairs 220 includes a first input word line input_1 and a second input word line input_1B. The first input word line input_1 is coupled to the first memory cell set 215 and the second memory cell set 216, and the second input word line input_1B is coupled to the third memory cell set 217 and the fourth memory cell set 218. The memory device 200 further includes a signal processing circuit 250 coupled to the first global bit line GBL(N) and the second global bit line GBLB(N). In this embodiment, the signal processing circuit 250 is implemented by a differential analog-to-digital converter (ADC) 250. The input word line pair 220 may provide a binary or ternary input signal. In addition, the input to the input word line pair 220 here is a single-level (SLC) input.

Further, the bit line (for example, BL1) of the first memory cell set 215 and the third memory cell set 217 may be coupled to the first global bit line GBL(N) via the bit line transistor BLT1, and the bit line (for example, BL9) of the second memory cell set 216 and the fourth memory cell set 218 may be coupled to the second global bit line GBLB(N)

via the bit line transistor BLT9. The first global bit line GBL(N) and the second global bit line GBLB(N) serve as output and are coupled to the differential analog-to-digital converter 250. Here, the first global bit line GBL(N) may be used to collect the read current representing the VMM product greater than 0, and the second global bit line GBLB(N) may be used to collect the read current representing the VMM product less than 0.

The differential analog-to-digital converter 250 is configured to detect which path of the first global bit line GBL(N) and the second global bit line GBLB(N) has a greater current value. In one of the embodiments, after the detection of the first global bit line GBL(N) and the second global bit line GBLB(N), the differential analog-to-digital converter 250 cancel the current each other in two paths to obtain the ADC value.

When VMM computing is performed using the memory array of FIG. 3A, the source line transistors SLT1 and SLT9 are turned on and the source line transistors SLT8 and SLT16 are turned off, so that the source lines SL1 and SL9 are coupled to the common source line CSL. For example, the common source line CSL is applied with a voltage of 0V. In addition, the bit line transistors BLT1 and BLT9 are turned on and the bit line transistors BLT8 and BLT16 are turned off, so that the source line BL1 is coupled to the first global bit line GBL(N), and the bit line BL9 is coupled to the second global bit line GBLB(N). For example, both the first global bit line GBL(N) and the second global bit line GBLB(N) are applied with a voltage of 0.2V.

The data stored in each of the first memory cell set 215, the second memory cell set 216, the third memory cell set 217, and the fourth memory cell set 218 are, for example, a single level of weight.

When VMM computing is performed, the computing result is differentiated between positive and negative. Furthermore, as described above, the first global bit line GBL(N) may be used to collect the read current Icell representing the VMM product greater than 0, and the second global bit line GBLB(N) may be used to collect the read current Icell representing the VMM product less than 0. Therefore, the operation of the circuit is required to generate positive and negative inputs (word line voltages) and positive and negative weights. In present embodiments, there is no physical negative inputs and negative weights applied for VMM computing. A new algorithm is to be designed.

As described above, according to the embodiment of the disclosure, an input word line pair 220 is used in inputting a voltage (the voltage applied to the word line). The first input word line input_1 may input_1 or 0, and the second input word line input_1B may also input_1 or 0. Here, 1 or 0 represents logic. When 1 is input, for example, a voltage of about 3V may be applied to the word line, and when 0 is input, for example, a voltage of about 0V may be applied to the word line. Accordingly, through the input combination of the first input word line input_1 and the second input word line input_1B of the input word line pair 220, a ternary input signal can be generated. For example, the first input word line input_1 inputs 1 and the second input word line input_1B inputs 0, which generates a positive input (+1); the first input word line input_1 inputs 0 and the second input word line input_1B inputs 0, which generates a zero input (0); and the first input word line input_1 inputs 0 and the second input word line input_1B inputs 1, which generates a negative input (−1). Thus, the disclosure can generate a ternary input signal (+1, 0,−1) without physically providing a negative input. In addition, a binary input signal can also be generated in this way.

Regarding positive and negative weights, according to the embodiment of the disclosure, for example, when the first memory cell set 215 and the fourth memory cell set 218 can read the read current Icell, and the read current Icell of the second memory cell set 216 and the third memory cell set 217 is 0, a positive weight (+1) can be generated in this situation. When the second memory cell set 216 and the third memory cell set 217 can read the read current Icell, and the read current Icell of the first memory cell set 215 and the fourth memory cell set 218 is 0, a negative weight (−1) can be generated in this situation. In addition, if the read currents Icell of the first memory cell set 215 to the fourth memory cell set 218 are all 0, a zero weight is generated.

When operating the memory device of FIG. 3A, if a positive voltage is input, the input voltage is applied to the first input word line input_1, and if the first memory cell set 215 has a positive weight, the multiplication of them represents a positive read current Icell. At this time, the read current Icell flows to the differential analog-to-digital converter 250 via the first global bit line GBL(N), which represents a positive product. Similarly, when the input voltage is applied to the first input word line input_1, the second memory cell set 216 has a negative weight, and the multiplication of them represents a negative read current Icell. At this time, the read current Icell flows to the differential analog-to-digital converter 250 via the second global bit line GBLB(N), which represents a negative product. Similarly, when the input voltage is applied to the second input word line input_1B (representing that the input is negative), the third memory cell set 217 has a negative weight, and the multiplication of them represents a positive read current Icell. At this time, the read current Icell flows to the differential analog-to-digital converter 250 via the first global bit line GBL(N), which represents a positive product. Similarly, when the input voltage is applied to the second input word line input_1B (representing that the input is negative), the fourth memory cell set 218 has a positive weight, and the multiplication of them represents a negative read current Icell. At this time, the read current Icell flows to the differential analog-to-digital converter 250 via the second global bit line GBLB(N), which represents a negative product.

Figure 3B:
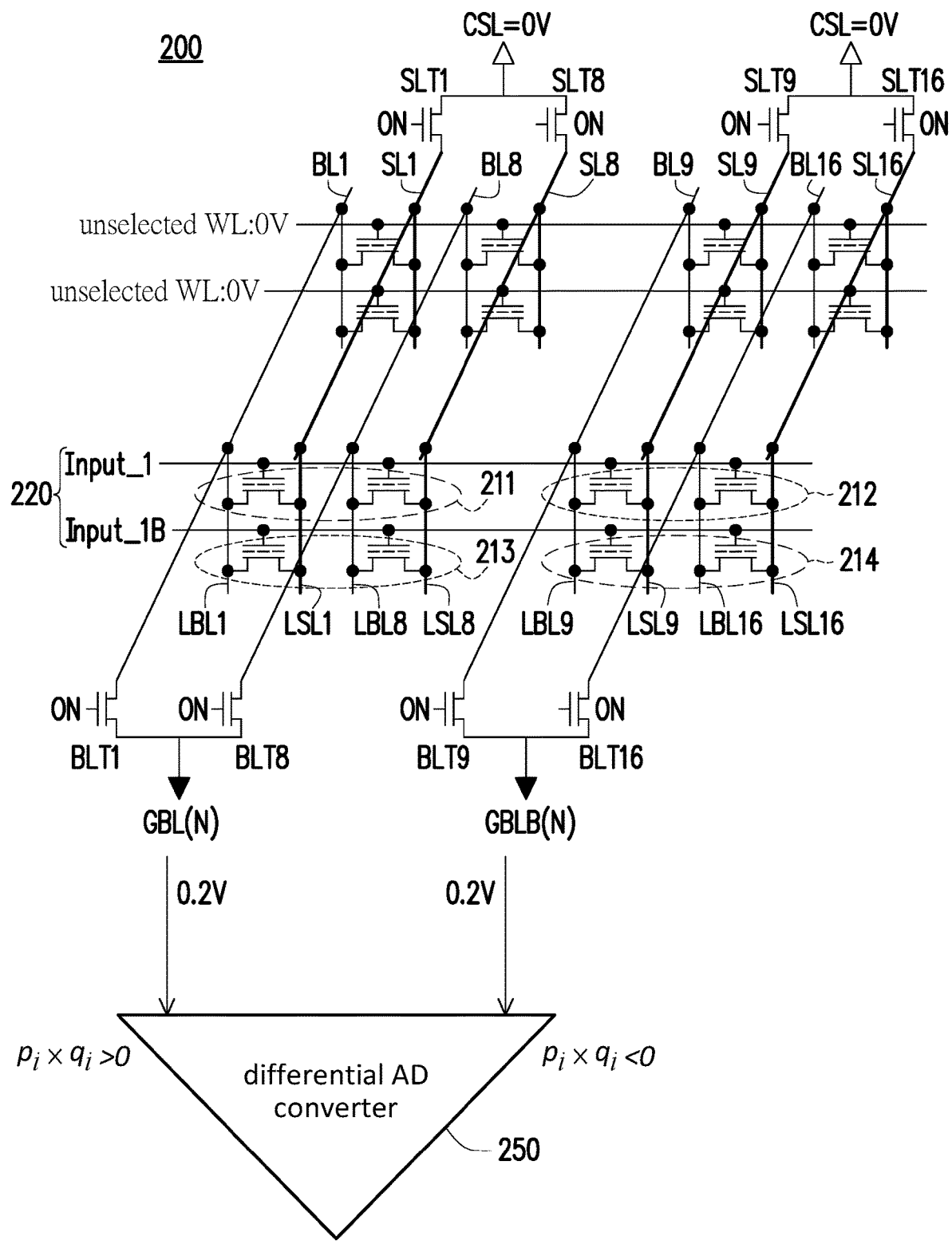
FIG. 3B is an another explanatory diagram showing a vector matrix multiplication operation performed by the 3D AND-type NOR flash memory device according to an embodiment of the disclosure.

FIG. 3B is an another explanatory diagram showing a vector matrix multiplication operation performed by the 3D AND-type NOR flash memory device according to an embodiment of the disclosure. The following describes how to apply the above-mentioned 3D AND-type NOR flash memory device to perform vector matrix multiplication (VMM), or called in-memory computing (CIM). This embodiment describes an example of a multiple-level weight CIM.

When applied to VMM, the memory device 100 of FIG. 2 is reconfigured as a memory device 200. The same or similar reference numerals will continue to be used, and only the differences are indicated. As shown in FIG. 3B, the memory array (for example, configured with the stacks 110 and 111 shown in FIG. 2) includes a plurality of first pairs of memory cells and a plurality of second pairs of memory cells. Here, for simplicity, only one first pair of memory cells and one second pair of memory cells are illustrated. The first pair of memory cells includes a first memory cell set 211 coupled to the first global bit line GBL(N) and a second memory cell set s 212 coupled to the second global bit line GBLB(N), and the second pair of memory cells includes a third memory cell set 213 coupled to the first global bit line GBL(N) and a fourth memory cell set coupled to the second global bit line GBLB(N). Here, each memory cell set 211, 212, 213, and 214 is illustrated as including two memory cells, but the number is not intended to limit the embodiment of the disclosure. The memory device 200 further includes a plurality of input word line pairs 220, one of which is illustrated here as an example. Each of the input word line pairs 220 includes a first input word line input_1 and a second input word line input_1B. The first input word line input_1 is coupled to the first memory cell set 211 and the second memory cell set 212, and the second input word line input_1B is coupled to the third set memory cell 213 and the fourth memory cell set 214. The memory device 200 further includes a signal processing circuit 250 coupled to the first global bit line GBL(N) and the second global bit line GBLB(N). In this embodiment, the signal processing circuit is implemented by a differential analog-to-digital converter (ADC) 250. The input word line pair 220 may provide a binary or ternary input signal. In addition, the input to the input word line pair 220 here is a single-level (SLC) input.

Furthermore, in accordance with the 3D NOR flash memory structure shown in FIG. 1, the memory device 200 includes two first drain side conductive strings and two second drain side conductive strings, which correspond to the local bit lines LBL1, LBL8, LBL9, and LBL16, respectively. The two first drain side conductive strings are respectively coupled to the first memory cell set 211 and the third memory cell set 213, and are coupled to the first global bit line GBL(N). The two second drain side conductive strings are respectively coupled to the second memory cell set 212 and the fourth memory cell set 214, and are coupled to the second global bit line GBLB(N). In addition, the memory device 200 includes two first source side conductive strings and two second source side conductive strings. The two first source side conductive strings are respectively coupled to the first memory cell set 211 and the third memory cell set 213, and are coupled to the common source line CSL. The two second source side conductive strings are respectively coupled to the second memory cell set 212 and the fourth memory cell set 214, and are coupled to the common source line CSL.

Further, each bit line (for example, BL1, BL8) of the first memory cell set 211 and the third memory cell set 213 may be coupled to the first global bit line GBL(N) via the bit line transistors BLT1 and BLT8, respectively, and each bit line (for example, BL9, BL16) of the second memory cell set 212 and the fourth memory cell set 214 may be coupled to the second global bit line GBLB(N) via the bit line transistors BLT9 and BLT16, respectively. The first global bit line GBL(N) and the second global bit line GBLB(N) serve as output and are coupled to the differential analog-to-digital converter 250. Here, the first global bit line GBL(N) may be used to collect the read current representing the VMM product greater than 0, and the second global bit line GBLB(N) may be used to collect the read current representing the VMM product less than 0.

The differential analog-to-digital converter 250 is configured to detect which path of the first global bit line GBL(N) and the second global bit line GBLB(N) has a greater current value. In one of the embodiments, after the detection of the first global bit line GBL(N) and the second global bit line GBLB(N), the differential analog-to-digital converter 250 cancel the current each other in two paths to obtain the ADC value.

When VMM computing is performed using the memory array of FIG. 3B, the source line transistors SLT1, SLT8, SLT9, and SLT16 are turned on, so that the source lines SL1, SL8, SL9, and SL16 are coupled to the common source line CSL. For example, the common source line CSL is applied with a voltage of 0V. In addition, the bit line transistors BLT1, BLT8, BLT9, and BLT16 are turned on, so that the bit lines BL1 and BL8 are coupled to the first global bit line GBL(N), and the bit lines BL9 and BL16 are coupled to the second global bit line GBLB(N). For example, both the first global bit line GBL(N) and the second global bit line GBLB(N) are applied with a voltage of 0.2V.

The data stored in the first memory cell set 211, the second memory cell set 212, the third memory cell set 213, and the fourth memory cell set 214 are, for example, 4 levels of weights. In this example, each memory cell set has two memory cells, so 8 levels of weights can be generated. In addition, if weight data of more levels is needed, each memory cell set may have more memory cells connected in parallel to generate weights of more levels.

When VMM computing is performed, the computing result is differentiated between positive and negative. Furthermore, as described above, the first global bit line GBL(N) may be used to collect the read current Icell representing the VMM product greater than 0, and the second global bit line GBLB(N) may be used to collect the read current Icell representing the VMM product less than 0. Therefore, the operation of the circuit is required to generate positive and negative inputs (word line voltages) and positive and negative weights. In present embodiments, there is no physical negative inputs and negative weights applied for VMM computing. A new algorithm is to be designed.

As described above, according to the embodiment of the disclosure, an input word line pair 220 is used in inputting a voltage (the voltage applied to the word line). The first input word line input_1 may input_1 or 0, and the second input word line input_1B may also input_1 or 0. Here, 1 or 0 represents logic. When 1 is input, for example, a voltage of about 3V may be applied to the word line, and when 0 is input, for example, a voltage of about 0V may be applied to the word line. Accordingly, through the input combination of the first input word line input_1 and the second input word line input_1B of the input word line pair 220, a ternary input signal can be generated. For example, the first input word line input_1 inputs 1 and the second input word line input_1B inputs 0, which generates a positive input (+1); the first input word line input_1 inputs 0 and the second input word line input_1B inputs 0, which generates a zero input (0); and the first input word line input_1 inputs 0 and the second input word line input_1B inputs 1, which generates a negative input (−1). Thus, the disclosure can generate a ternary input signal (+1, 0,−1) without physically providing a negative input. In addition, a binary input signal can also be generated in this way.

Regarding positive and negative weights, according to the embodiment of the disclosure, for example, when the first memory cell set 211 and the fourth memory cell set 214 can read the read current Icell, and the read current Icell of the second memory cell set 212 and the third memory cell set 213 is 0, a positive weight (+1) can be generated in the situation. When the second memory cell set 212 and the third memory cell set 213 can read the read current Icell, and the read current Icell of the first memory cell set 211 and the fourth memory cell set 214 is 0, a negative weight (−1) can be generated in the situation. In addition, if the read currents Icell of the first memory cell set 211 to the fourth memory cell set 214 are all 0, a zero weight can be generated.

When operating the memory device of FIG. 3B, if a positive voltage is input, the input voltage is applied to the first input word line input_1 and if the first memory cell set 211 has a positive weight, the multiplication of them represents a positive read current Icell. At this time, the read current Icell flows to the differential analog-to-digital converter 250 via the first global bit line GBL(N), which represents a positive product. Similarly, when the input voltage is applied to the first input word line input_1, the second memory cell set 212 has a negative weight, and the multiplication of them represents a negative read current Icell. At this time, the read current Icell flows to the differential analog-to-digital converter 250 via the second global bit line GBLB(N), which represents a negative product. Similarly, when the input voltage is applied to the second input word line input_1B (representing that the input is negative), the third memory cell set has a negative weight, and the multiplication of them represents a positive read current Icell. At this time, the read current Icell flows to the differential analog-to-digital converter 250 via the first global bit line GBL(N), which represents a positive product. Similarly, when the input voltage is applied to the second input word line input_1B (representing that the input is negative), the fourth memory cell set 214 has a positive weight, and the multiplication of them represents a negative read current Icell. At this time, the read current Icell flows to the differential analog-to-digital converter 250 via the second global bit line GBLB(N), which represents a negative product.

In summary, the following Table I lists the outputs of GBL(N) and GBLB(N) in relation to the input of Input_1 and Input_1B (positive, zero and negative inputs) and the weights (positive, zero and negative weights).

TABLE I

|  | Positive Input Input_1 = 1, Input_1B = 0 | Zero Input Input_1 = 0, Input_1B = 0 | Negative Input Input_1 = 0, Input_1B = 1 |
| --- | --- | --- | --- |
| Positive Weight first & fourth memory cell set = 1 second & third memory cell set = 0 | GBL(N): 1 GBLB(N): 0 | GBL(N): 0 GBLB(N): 0 | GBL(N): 0 GBLB(N): 1 (represent −1) |
| Zero Weight first & fourth memory cell set = 0 second & third memory cell set = 0 | GBL(N): 0 GBLB(N): 0 | GBL(N): 0 GBLB(N): 0 | GBL(N): 0 GBLB(N): 0 |
| Negative Weight first & fourth memory cell set = 0 second & third memory cell set = 1 (Icell) | GBL(N): 0 GBLB(N): 1 (represent −1) | GBL(N): 0 GBLB(N): 0 | GBL(N): 1 GBLB(N): 0 |

Accordingly, in all the word lines and bit lines, the positive read currents Icell are summed to generate a positive VMM product and a negative VMM product, and transmitted to the differential analog-to-digital converter 250 for comparison, so as to generate a digital value.

To sum up, through the architecture and algorithm shown in FIG. 3B, after the read currents Icell of the first global bit line GBL(N) are summed, the sum can represent the positive VMM product value VMM (positive), and after the read currents Icell of the second global bit line GBLB(N) are summed, the sum can represent the negative VMM product value VMM (negative). The calculations of the above two may be as follows.

$$VMM(\text{positive}) = IGBL(j) = \sum_{i=1}^{N\ (WL's)} \sum_{k=1}^{M\ (BLT's)} g_m(i, k) * V_{WL}(i)$$

$$VMM(\text{negative}) = IGBLB(j) = \sum_{i=1}^{N\ (WL's)} \sum_{k=1}^{M\ (BLT's)} g_m(i, k) * V_{WL}(i)$$

where $g_m$ (i, k) is the transconductance of the memory cell, $V_{WL}(i)$ is the voltage applied to the word line, i is the number of word lines, k is the number of bit lines, and j is the number of global bit lines. Thus, the voltage $V_{WL}(i)$ applied to the word line multiplied by the transconductance $g_m$ (i, k) of the memory cell corresponds to the read current Icell of the memory cell. This transconductance $g_m$ (i, k) corresponds to the weight described above. Thus, $p_i \times q_i > 0$ (the VMM product is greater than 0) and $p_i \times q_i < 0$ (the VMM product is less than 0) can be obtained from the summation of the read currents of the memory cells of the memory array. $p_i$ and $q_i$ are arbitrary numbers, that is, values that can be calculated using the above-mentioned word line voltage $V_{WL}(i)$ and weight $g_m$ (i, k).

Figure 3C:
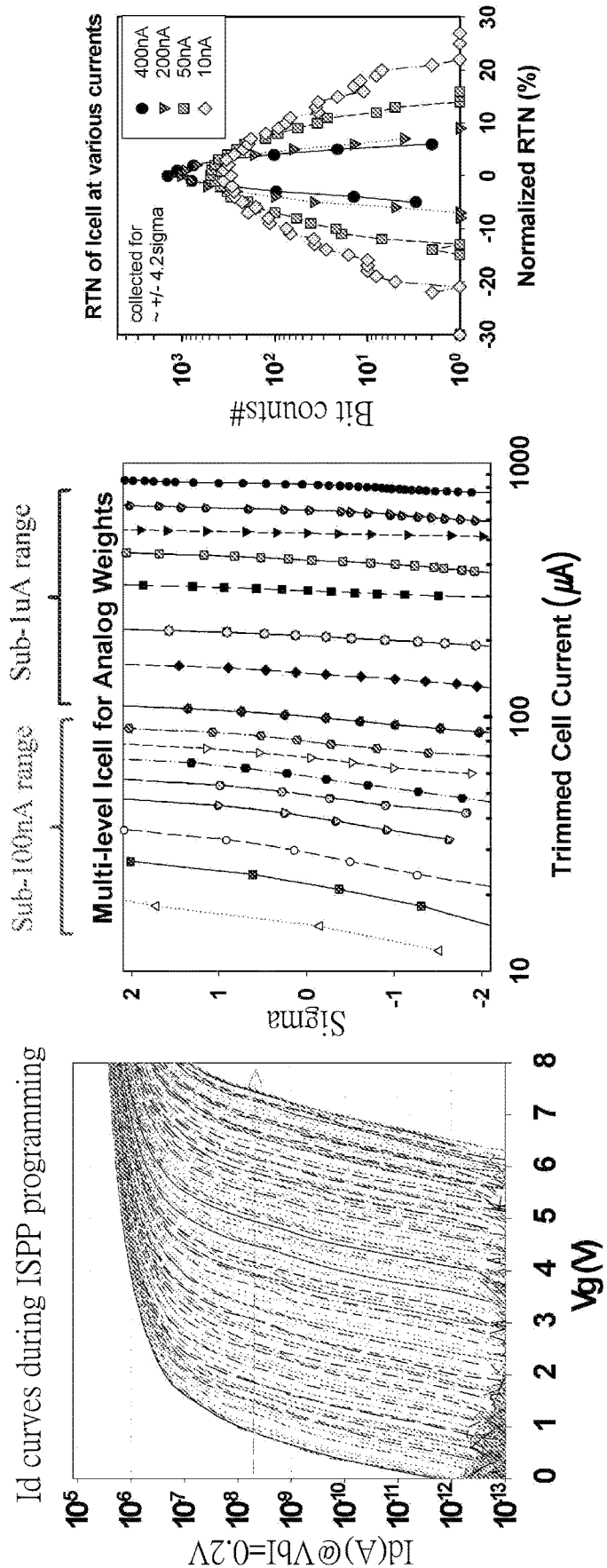
FIG. 3C shows a distribution diagram of the gate voltage and read current Icell (left), a distribution diagram of the memory cell read current and standard deviation σ after trimming (middle), and a distribution diagram of the positive planning RTN and bit count (right).

FIG. 3C shows a distribution diagram of the gate voltage and read current Icell (left), a distribution diagram of the memory cell read current and standard deviation σ after trimming (middle), and a distribution diagram of the positive planning RTN and bit count (right). As shown on the left side of FIG. 3C, it is a measurement diagram of the drain current (Id) and the gate voltage (Vg) when incremental step pulse programming (ISPP) is performed. The horizontal axis represents the gate voltage Vg, that is, the voltage applied to the word line; and the vertical axis represents the read current Icell when the bit line voltage $V_{BL}$ is 0.2V. Here, it is desirable that the read current Icell can be controlled when operating at a low bit line voltage $V_{BL}$=0.2V (bit line voltage $V_{BL}$=1.2V during normal reading). In the example described above, the input voltage (word line voltage $V_{WL}$) is about 2V to 3V, so it is possible to find the corresponding current between Vg=2V to 3V in FIG. 3C and trim the range of different read currents Icell, such as the range of sub-100 nA to sub-1 μA. According to the diagram in the middle of FIG. 3C, the read current Icell is better in the sub-1 μA range, and according to the diagram on the right side of 3C, there is a smaller RTN in the sub-1 μA range.

Figure 3D:
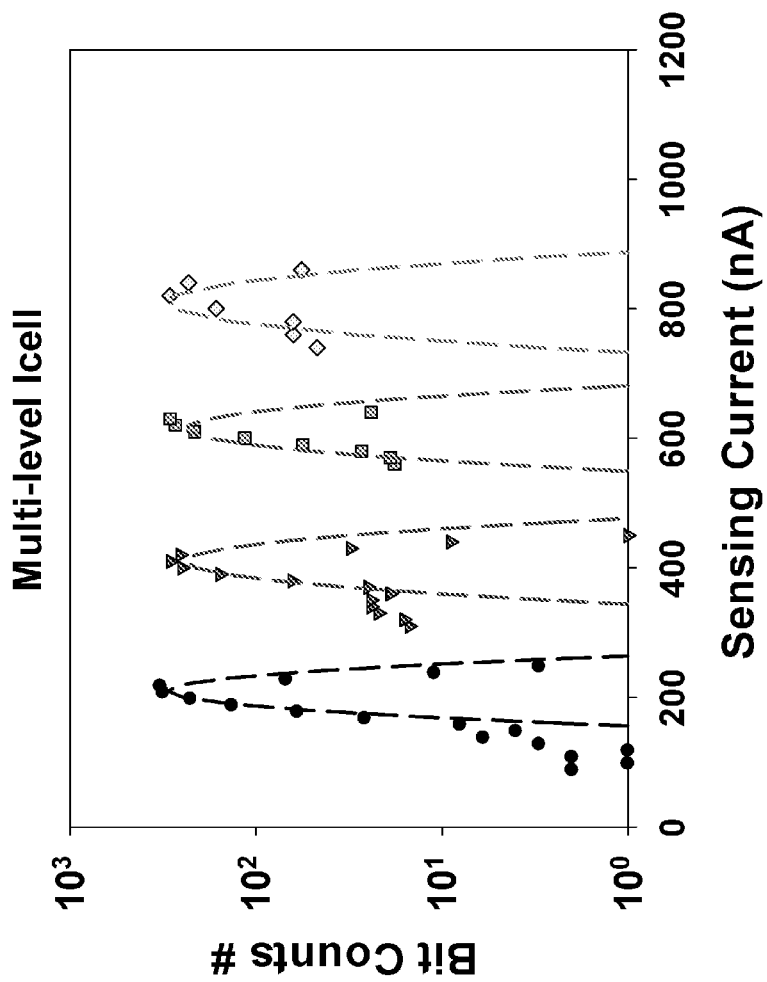
FIG. 3D is a schematic diagram showing a distribution of the read current Icell of the memory cell.

FIG. 3D is a schematic diagram showing a distribution of the read current Icell of the memory cell. As described above, in order for the in-memory computing to have good results, it is desirable to generate a tight and properly spaced distribution of read currents Icell, and to have a smaller RTN and good retention. Therefore, if the input voltage (word line voltage) is around 2V to 3V, the distribution of the read current Icell is preferably trimmed to the distribution in the range of sub-1 μA as shown in FIG. 3D, such as 200 nA, 400 nA, 600 nA, and 800 nA. When the input voltage is around 2V to 3V, it is preferable to correct the distribution of the read current Icell to the range of sub-1 μA. Accordingly, 4 levels of weights can be obtained.

Taking the first set of memory cells 211 (storing positive weights) and the second set of memory cells 212 (storing negative weights) of the first pair of memory cells as an example, each set of memory cells includes two memory cells, so the first pair of memory cells includes four memory cells in total, and each memory cell has 4 levels of read current Icell, which represent 4 level weights. When the four bit line transistors BLT1, BLT8, BLT9, and BLT16 are all turned on, a total of 16 levels of weights (e.g., −8 to −1 for negative weight, 0 to +7 for positive weight) can be generated, that is, 4-bit resolution.

Figure 4:
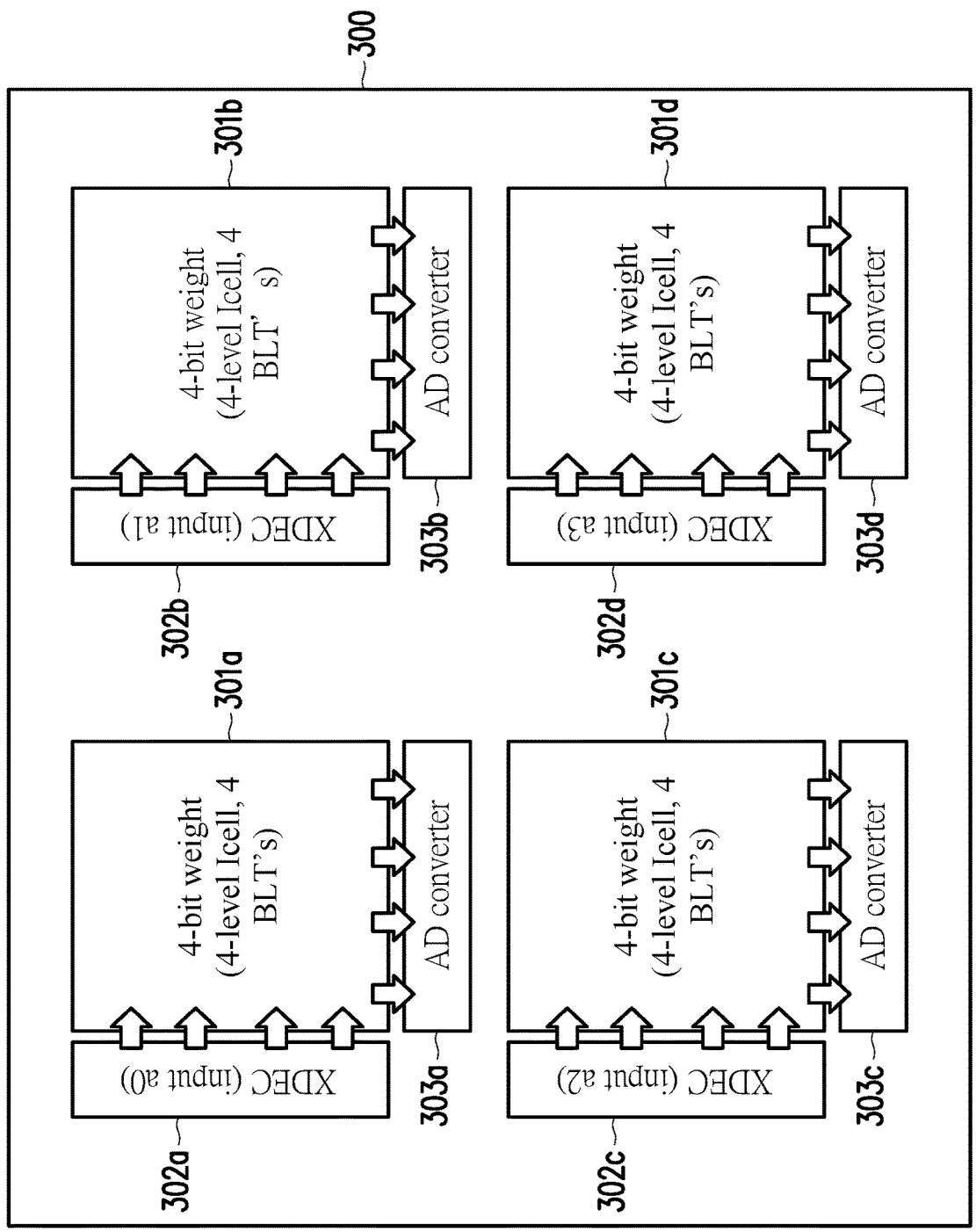
FIG. 4 is a schematic diagram showing an architecture for generating 4 inputs 4 weights (4I4W) in the digital domain.

In the above architecture, the input signal is mainly a single-level input. If multi-level inputs are to be generated, multiple architectures based on FIG. 3B above may be used. FIG. 4 is a schematic diagram showing an architecture for generating 4 inputs 4 weights (4I4W) in the digital domain.

As shown in FIG. 4, the memory device 300 includes four memory arrays 301a, 301b, 301c, and 301d (four tiles). The memory arrays 301a, 301b, 301c, and 301d respectively have X decoders 302a, 302b, 302c, and 302d and AD converters 303a, 303b, 303c, and 303d corresponding thereto. Here, each of the memory arrays 301a, 301b, 301c, and 301d, the corresponding X decoders 302a, 302b, 302c, and 302d, and the corresponding AD converters 303a, 303b, 303c, and 303d may use the architecture shown in FIG. 3B. Each of the memory arrays 301a, 301b, 301c, and 301d has a weight of 4 bits, that is, 4 levels of read current Icell with four bit line transistors BLTs. Therefore, the memory cell here is a multiple level cell (MLC), which has 4 levels in this example.

In addition, the word line of each of the memory arrays 301a, 301b, 301c, and 301d receives a single-level (SLC) input, but the input voltage is different. For example, the input of the memory array 301a is $a_0$, the input of the memory array 301b is $a_1$, the input of the memory array 301c is $a_2$, and the input of the memory array 301d is $a_3$.

Further, the four memory arrays 301a, 301b, 301c, and 301d cyclically repeat computing to output the results, and finally the outputs of the four AD converters are summed. This can be achieved using shifters and adders. The output of the memory array 301a is equivalent to the least significant bit (LSB), and the output of the memory array 301d is equivalent to the most significant bit (MSB). Thus, the outputs of the four memory arrays 301a, 301b, 301c, and 301d are respectively multiplied by the corresponding weight coefficients, such as $1(=2^0)$, $2(=2^1)$, $4(=2^2)$, $8(=2^3)$, and so on.

Through the above architecture, a 4-input 4-weight (4I4W) architecture with positive and negative polarities can be generated. In summary, the generation of this architecture requires:

[1] the design of 4 memory cells in two tiles to generate positive and negative polarities;

[2] multi-level unit memory cell (4 levels in this example) to generate four read currents Icell (corresponding to four weights (W0, W1, W2, and W3);

[3] four bit line transistors BLT connected to each bit line; and

[4] four tiles to generate 4-bit inputs ($a_0$, $a_1$, $a_2$, and $a_3$).

Finally, the VMM output of the above-mentioned memory device 300 can be expressed by the following equation:

$$VMM = (W3\,W2\,W1\,W0) \times 1 \times a_0 + (W3\,W2\,W1\,W0) \times 2 \times a_1 + (W3\,W2\,W1\,W0) \times 4 \times a_2 + (W3\,W2\,W1\,W0) \times 8 \times a_3$$

Figure 5:
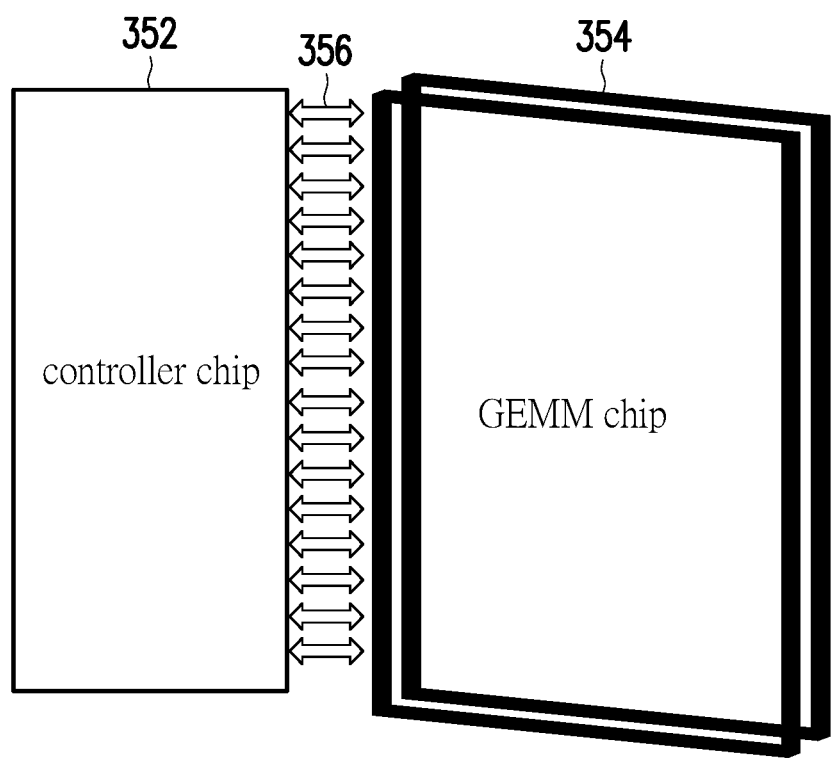
FIG. 5 is a schematic diagram showing a solid-state drive module according to an embodiment of the disclosure.

FIG. 5 is a schematic diagram showing a solid-state drive module according to an embodiment of the disclosure. The solid-state drive module (SSD module) 350 shown in FIG. 5 can be applied to, for example, an AI inference system, which needs to perform computing for a large amount of data, especially matrix multiplication computing. As shown in FIG. 5, the solid-state drive module 350 includes a controller chip 352 and a general matrix multiplication (GEMM) chip 354, and data transmission can be performed between the controller chip 352 and the general matrix multiplication chip 354 through an interface 356. This interface may be, for example, an interface equivalent to or similar to DDR4/5. Additionally, the controller chip 352 may be coupled to a plurality of general matrix multiplication chip 354. In other embodiments, the general matrix multiplication chip 354 is a standalone chip.

The general matrix multiplication chip 354 constructed from the above-mentioned FIG. 3B (that is, using 3D NOR flash memory) may have, for example, 512 inputs (4 bits) and 1024 outputs (4 bits). Each GEMM chip 354 can support multiple GB memory cells to directly compute billions of parameters in large neural networks. The GEMM chip 354 is connected to the controller chip 352 through the interface 356 such as DDR5 (4.8 Gbps, 16 I/O). In addition to a control circuit, the controller chip 352 only needs a SRAM of an appropriate size to store meta data for controlling the AI data flow, and does not need a large number of ALUs and multiple cores (for example, a SOC ASIC architecture requires more than 100 cores to achieve equivalent computing) to support vector matrix multiplication (VMM). Under this architecture, all VMM computing is performed in the GEMM chip 354. Under the above-mentioned 4I4W architecture, the internal maximum VMM computing bandwidth is ~3.7 TOPS, which is much larger than the I/O of DDR5. In addition, the power consumption per chip is less than 1W. Thus, the GEMM chip 354 is fast and has low power consumption.

In this architecture, because all vector matrix multiplication computing is performed within the GEMM chip 354, the controller chip 352 only needs to provide inputs to the GEMM chip 354. The GEMM chip 354 performs vector matrix multiplication computing and then provides outputs to the controller chip 352. Thus, under this architecture, it is not necessary to read out the data in the memory and then perform computing through the ALU. As a result, the vector matrix multiplication for a large amount of data can be performed efficiently and quickly.

Figure 6A:
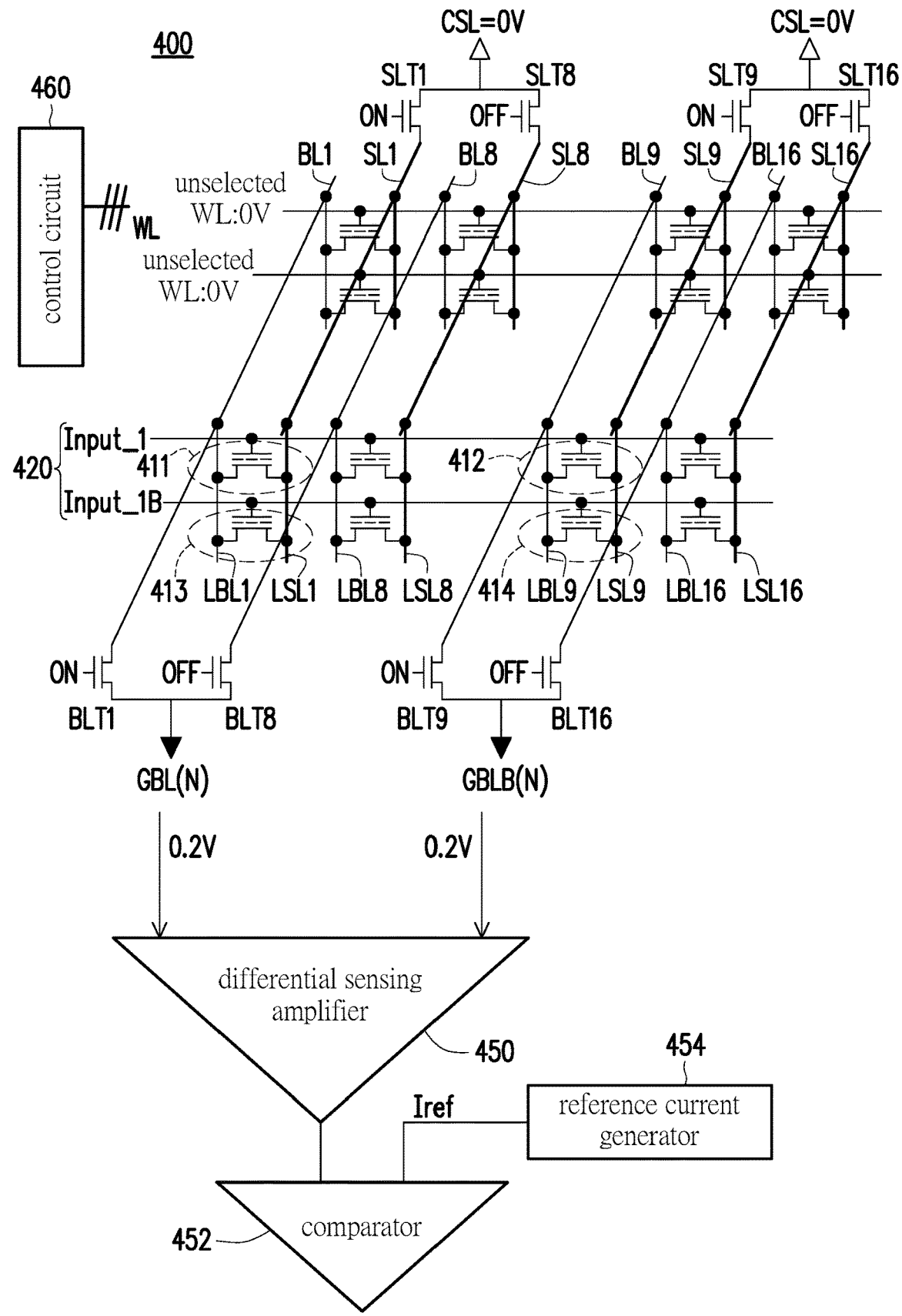
FIG. 6A shows an architecture and an operation of the 3D AND-type NOR flash memory applied for computing Cosine similarity according to an embodiment of the disclosure.

FIG. 6A shows an architecture and an operation of the 3D AND-type NOR flash memory applied for computing Cosine similarity according to an embodiment of the disclosure. As shown in FIG. 6A, this architecture is basically similar to the architecture of FIG. 3A. Only the differences will be described hereinafter, and the other details are the same as those of FIG. 3A. The Cosine similarity computing can be applied to perform in-memory search (IMS).

The memory array of the memory device 400 includes a plurality of first pairs of memory cells and a plurality of second pairs of memory cells. Here, for simplicity, only one first pair of memory cells and one second pair of memory cells are illustrated. The first pair of memory cells includes a first memory cell set (or referring to a first memory cell) 411 coupled to the first global bit line GBL(N) and a second memory cell set (or referring to a second memory cell) 412 coupled to the second global bit line GBLB(N), and the second pair of memory cells includes a third memory cell set (or referring to a third memory cell) 413 coupled to the first global bit line GBL(N) and a fourth memory cell set (or referring to a fourth memory) 414 coupled to the second global bit line GBLB(N). In this embodiment, each of the memory cell sets 411-414 includes one memory cell.

The memory device 400 further includes a plurality of input word line pairs 420. Each of the plurality of input word line pairs 420 (for example, the WL1 pair) includes a first input word line input_1 and a second input word line input_1B. The first input word line input_1 is coupled to the first memory cell 411 and the second memory cell 412, and the second input word line input_1B is coupled to the third memory cell 413 and the fourth memory cell 414. Each of the plurality of input word line pairs provides a ternary input signal, that is, the ternary input (+1, 0,−1) as described above. For details, please refer to the description of FIG. 3A or 3B.

Here, the positive input signal (+1) is to turn on the first input word line input_1 of the input word line pair 420 (taking the WL1 pair as an example), and turn off the second input word line input_1B; the zero input signal (0) is to turn off the first input word line input_1 of the input word line pair 420 (taking the WL1 pair as an example), and turn off the second input word line input_1B; and the negative input signal (−1) is to turn off the first input word line input_1 of the input word line pair 420 (taking the WL1 pair as an example), and turn on the second input word line input_1B. Similarly, the input to the input word line pair 420 here is a single-level (SLC) input.

The memory device 400 further includes a signal processing circuit 450 connected to the first global bit line GBL(N) and the second global bit line GBLB(N). In this embodiment, the signal processing circuit 450 is implemented by a differential sensing amplifier. When this architecture is used in Cosine similarity computing, it mainly compares the input signal with the data stored in the memory. In one of the embodiments, the differential analog-to-digital converter 350 shown in FIG. 3A or 3B is not required.

In addition, the same as the VMM computing of FIG. 3A or 3B, the memory array stores the weight information used for IMS computing. The positive IMS weight is stored in the first memory cell 411 and the fourth memory cell 414, and the negative IMS weight is stored in the second memory cell 412 and the third memory cell 413.

Moreover, the memory device 400 may further include a control circuit 460 coupled to the memory array and a plurality of input word line pairs for controlling the memory array to perform Cosine similarity computing. For example, the control circuit 460 may include a decoder to input the input signal to the corresponding input word line pair. The memory device 400 may further include a comparator 452 and a reference current generator 454. The comparator 452 is coupled to the differential sensing amplifier 450 and the reference current generator 454. The reference current generator 454 generates a reference signal Iref, and the comparator 452 compares the output of the differential sensing amplifier 450 with the reference signal Iref In an embodiment, the reference signal Iref is adjustable corresponding to a Cosine similarity computing threshold.

In addition, the same as the operation described in FIG. 3A or 3B, the first global bit line GBL(N) collects the positive read currents Icell, and the second global bit line GBLB(N) collects the negative read currents Icell. The sum of the positive read currents Icell and the sum of the negative read currents Icell are sent to the differential sensing amplifier 450, and the difference between the sum of the positive read currents Icell and the sum of the negative read currents Icell is output.

The Cosine similarity computing is expressed as follows:

$$VMM = \Sigma_{i=1}^{N} p_i \times q_i = |p||q|\cos\theta$$

The Cosine similarity computing is also an application of vector matrix multiplication. Here, $p_i$ is an input vector (query), that is, an input signal (for example, a ternary signal of +1, 0, and −1) input from the word line pair 420. $q_i$ is the data stored in the memory, that is, the weight information.

Figure 6B:
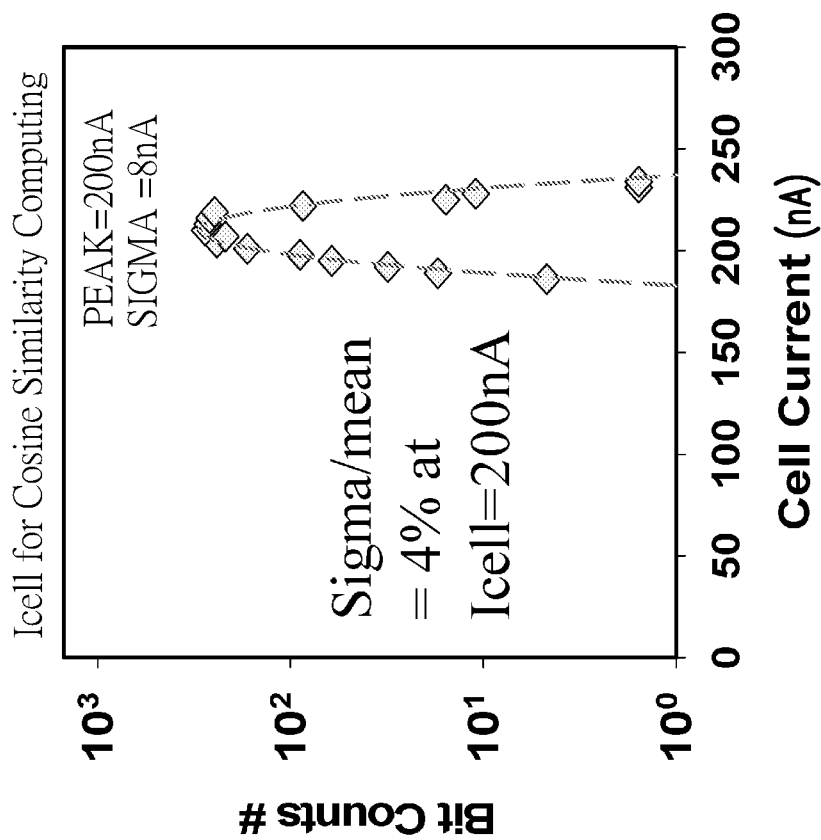
FIG. 6B is a schematic diagram showing a distribution of the read current Icell of the memory cell under the architecture of FIG. 6A.

In the Cosine similarity computing, the memory cell uses the single-level read current distribution as shown in FIG. 6B, preferably the distribution with the read current Icell of 200 nA. Under this distribution, the standard deviation σ is 4%.

In addition, under this architecture, there can be 512 word lines WL and 1024 outputs, that is, corresponding to 1024 differential sensing amplifiers. Furthermore, the thread is about 100 ns, and the bandwidth of similarity search is 512×1024/100 ns, that is, 5 TB/s. Thus, it is possible to achieve high-capacity and high-speed computing.

Accordingly, after the comparator 452 compares the output of the sensing amplifier 450 with the reference signal Iref, it is possible to detect whether the input signal matches the data stored in the memory (pass), or does not match (fail). Therefore, when the in-memory computing is applied to the Cosine similarity computing, it can be used for face recognition. Under this architecture, it is not necessary to read out the data in the memory device for search, and IMS computing may be performed by simply inputting the input signal (for example, the face data to be confirmed) into the memory device. The memory device then provides the search to an external system. In addition, the memory device according to the disclosure as described above has a capacity large enough and an execution speed fast enough, and can quickly output the search without occupying system resources.

According to an embodiment of the disclosure, the operation architecture of the memory device for in-memory computing is constructed using a 3D AND-type NOR flash memory. Thus, in the embodiment of the disclosure, the data in the memory may not be read to the outside to be computed by another ALU, so the system data can be saved, and data update is not always required for the data read to the external storage device. In addition, the architecture of the disclosure can achieve high-capacity, high-speed, and high-efficiency in-memory computing. Thus, VMM computing, IMS computing, etc. that are commonly used in big data or AI applications such as image processing, face recognition, deep neural network, etc., can be implemented through the architecture of the disclosure.

What is claimed is:

1. A memory device for computing in-memory, comprising:
    a memory array comprising a plurality of first pairs of memory cells and a plurality of second pairs of memory cells, wherein each of the plurality of first pairs of memory cells comprises a first memory cell set coupled to a first global bit line and a second memory cell set coupled to a second global bit line, and each of the plurality of second pairs of memory cells comprises a third memory cell set coupled to the first global bit line and a fourth memory cell set coupled to the second global bit line;
    a plurality of input word line pairs, wherein each of the plurality of input word line pairs comprises a first input word line and a second input word line, the first input word line is coupled to the first memory cell set and the second memory cell set, and the second input word line is coupled to the third memory cell set and the fourth memory cell sets; and a signal processing circuit coupled to the first global bit line and the second global bit line.

2. The memory device according to claim 1, wherein the plurality of input word line pairs provides binary or ternary input signals.

3. The memory device according to claim 2, wherein the memory array stores weight information for computing in-memory, wherein a first VMM weight is stored in the first memory cell set and the fourth memory cell set, and a second VMM weight is stored in the second memory cell set and the third memory cell set.

4. The memory device according to claim 1, wherein the signal processing circuit is a differential analog-to-digital converter and the first to the fourth memory cell sets respectively comprise one memory cell.

5. The memory device according to claim 1, wherein the signal processing circuit is a differential analog-to-digital converter and the first to the fourth memory cell sets respectively comprise two memory cells, and the memory device further comprises:
two first drain side conductive strings coupled to the first memory cell set, the third memory cell set, and the first global bit line; and
two second drain side conductive strings coupled to the fourth memory cell set, the second memory cell set, and the second global bit line.

6. The memory device according to claim 5, further comprising:
a plurality of bit line transistors coupled between the two first drain side conductive strings and the first global bit line, and are coupled between the two second drain side conductive strings and the second global bit line.

7. The memory device according to claim 5, further comprising:
two first source side conductive strings respectively coupled to the first memory cell set and the third memory cell set, and are coupled to a common source line; and
two second source side conductive strings respectively coupled to the second memory cell set and the fourth memory cell set, and are coupled to the common source line.

8. The memory device according to claim 3, wherein the weight information stored in the memory array comprises weights of four levels.

9. The memory device according to claim 1, wherein the first global bit line and the second global bit line are configured to sum memory cell currents from the memory array, and one of the memory cell currents for one memory cell of the memory array is greater than 100 nA and less than 1 μA.

10. The memory device according to claim 9, wherein a sensing voltage is applied to the first global bit line and the second global bit line to sum the memory cell currents from the memory array, and the sensing voltage is less than 0.2V.

11. The memory device according to claim 1, wherein each of the plurality of input word line pairs provides a 1-bit input signal.

12. The memory device according to claim 1, wherein the memory array is a 3D NOR flash memory.

13. The memory device according to claim 5, wherein the two first drain side conductive strings and the two second drain side conductive strings are doped polysilicon plugs.

14. The memory device according to claim 1, wherein the first to the fourth memory cell sets respectively comprise one memory cell, and the memory device is configured to perform an in-memory search, and
the signal processing circuit is a differential sensing amplifier, and the differential sensing amplifier is coupled to the first global bit line and the second global bit line.

15. The memory device according to claim 14, wherein each of the plurality of input word line pairs provides a binary or ternary input signal.

16. The memory device according to claim 14, wherein the memory array stores weight information for in-memory search, wherein a first IMS weight is stored in the first memory cell and the fourth memory cell, and a second IMS weight is stored in the second memory cell and the third memory cell.

17. The memory device according to claim 14, further comprises:
a control circuit coupled to the memory array and the plurality of input word line pairs and controlling the memory array to perform a cosine similarity computing to perform the in-memory search; and
a comparator coupled to the differential sensing amplifier and a reference signal generator, wherein the reference signal generator generates a reference signal, and the comparator compares an output of the differential sensing amplifier with the reference signal.

18. The memory device according to claim 17, wherein the reference signal is adjustable corresponding to a Cosine similarity computing threshold.

19. A solid-state drive module, comprising:
a controller chip;
a memory chip, which is the memory device for in-memory computing according to claim 1, and is coupled to the controller chip; and
an interface coupled to the controller chip and the memory chip.

20. The solid-state drive module according to claim 19, wherein the interface is DDR4 or DDR5.

* * * * *